United States Patent
Strickland et al.

(10) Patent No.: US 11,777,441 B2
(45) Date of Patent: Oct. 3, 2023

(54) THERMOELECTRIC POWER GENERATION USING RADIANT AND CONDUCTIVE HEAT DISSIPATION

(71) Applicant: Hamilton Sundstrand Corporation, Charlotte, NC (US)

(72) Inventors: Julie Strickland, Houston, TX (US); Ashley Rose Himmelmann, Beloit, WI (US); Samuel Anderson, Houston, TX (US); Jake Rohrig, Simsbury, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 109 days.

(21) Appl. No.: 17/220,010

(22) Filed: Apr. 1, 2021

(65) Prior Publication Data
US 2022/0321053 A1    Oct. 6, 2022

(51) Int. Cl.
| | |
|---|---|
| *H02S 10/30* | (2014.01) |
| *H02S 20/32* | (2014.01) |
| *H02S 40/42* | (2014.01) |
| *H10N 10/17* | (2023.01) |

(52) U.S. Cl.
CPC .............. *H02S 10/30* (2014.12); *H02S 20/32* (2014.12); *H02S 40/425* (2014.12); *H10N 10/17* (2023.02)

(58) Field of Classification Search
CPC . H01L 35/28–325; H01L 35/06; H01L 35/10; H01L 31/052–0525; H01L 31/0543; F24F 5/0042; F24F 5/0046; F24F 5/005; F24F 2005/0064; F24F 2005/0067; H02S 40/42
See application file for complete search history.

(56) References Cited

U.S. PATENT DOCUMENTS

| | | | |
|---|---|---|---|
| 4,235,221 A * | 11/1980 | Murphy | ............... H02S 40/44 126/567 |
| 4,710,588 A | 12/1987 | Ellion | |
| 5,936,193 A | 8/1999 | Parise | |
| 8,008,573 B2 | 8/2011 | Dai et al. | |
| 8,420,926 B1 | 4/2013 | Reedy et al. | |
| 8,969,717 B2 | 3/2015 | Sager | |

(Continued)

FOREIGN PATENT DOCUMENTS

| | | |
|---|---|---|
| CN | 202435312 U | 9/2012 |
| CN | 104408534 B | 4/2018 |

(Continued)

OTHER PUBLICATIONS

Extended European Search Report for EP Application No. 22160391. 3, dated Aug. 5, 2022, pp. 1-7.

*Primary Examiner* — Ryan S Cannon
(74) *Attorney, Agent, or Firm* — CANTOR COLBURN LLP

(57) ABSTRACT

A thermoelectric power generation system includes a solar panel array on a first side of a tower to absorb solar radiation and generate electrical energy and waste heat and a panel on a second side, opposite the first side, of the tower. A plurality of thermoelectric elements of the tower are interposed between the solar panel array and the panel. The plurality of thermoelectric elements converts conductive heat flow of the waste heat from the solar panel directed toward the panel to electrical energy. A conductive base supports the tower and to conduct heat away from the panel.

16 Claims, 2 Drawing Sheets

(56) References Cited

U.S. PATENT DOCUMENTS

| | | |
|---|---|---|
| 8,975,505 B2 | 3/2015 | Ladner |
| 8,991,117 B1 | 3/2015 | Walker et al. |
| 9,140,241 B2 | 9/2015 | Bootello et al. |
| 2011/0209744 A1 | 9/2011 | Hu |
| 2012/0192920 A1 | 8/2012 | McCowan et al. |
| 2019/0341876 A1* | 11/2019 | Webb ................ H02S 40/32 |
| 2020/0036324 A1* | 1/2020 | Obeto ................ F24S 20/40 |

FOREIGN PATENT DOCUMENTS

| | | | |
|---|---|---|---|
| CN | 108667347 A | 10/2018 | |
| KR | 20190138951 A | 12/2019 | |
| RU | 2724206 C1 | 6/2020 | |
| WO | 2020156598 A1 | 8/2020 | |

* cited by examiner

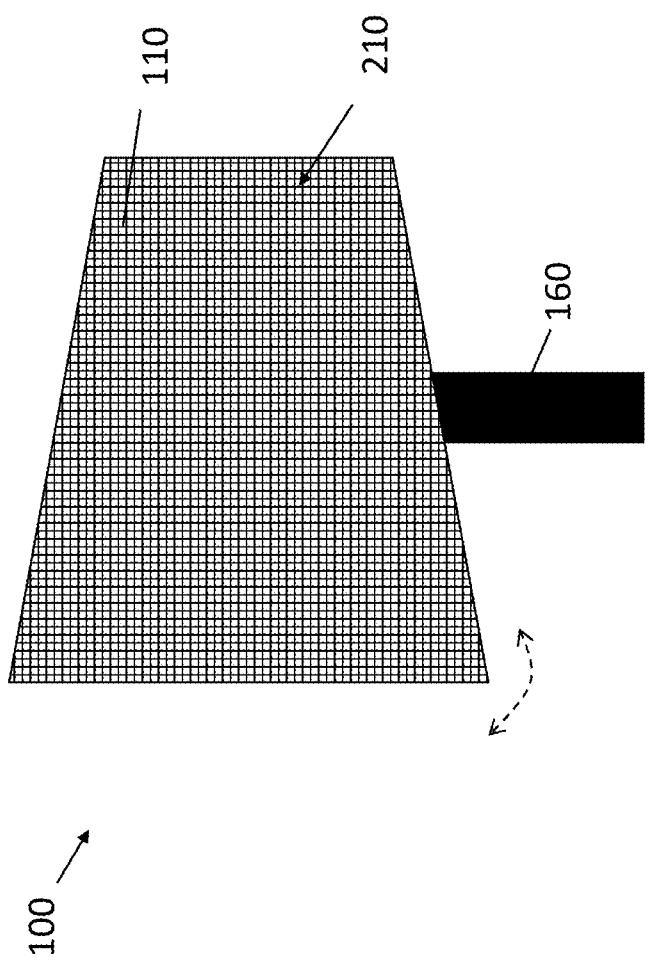

THERMOELECTRIC POWER GENERATION USING RADIANT AND CONDUCTIVE HEAT DISSIPATION

BACKGROUND

Exemplary embodiments pertain to the art of power generation and, in particular, to thermoelectric power generation using radiant and conductive heat dissipation.

On-site power generation presents both an opportunity and a challenge in space travel. Power generation capability reduces the need to carry bulky power storage devices that add to launch costs. Yet, many types of power generation used on earth are impractical due to the extreme environment of space or are impractical due to inefficiency.

BRIEF DESCRIPTION

In one embodiment, a thermoelectric power generation system includes a solar panel array on a first side of a tower to absorb solar radiation and generate electrical energy and waste heat, and a panel on a second side, opposite the first side, of the tower. A plurality of thermoelectric elements of the tower are interposed between the solar panel array and the panel. The plurality of thermoelectric elements being converts conductive heat flow of the waste heat from the solar panel directed toward the panel to electrical energy. A conductive base supports the tower and to conduct heat away from the panel.

Additionally or alternatively, in this or other embodiments, the thermoelectric power generation system also includes insulating material between the solar panel array and the panel around the thermoelectric elements.

Additionally or alternatively, in this or other embodiments, the thermoelectric power generation system also includes a gimbal to control an orientation of the tower.

Additionally or alternatively, in this or other embodiments, the gimbal is changes a position of the tower in a first dimension and in a second dimension, perpendicular to the first dimension.

Additionally or alternatively, in this or other embodiments, the thermoelectric power generation system also includes a controller to control the gimbal.

Additionally or alternatively, in this or other embodiments, the conductive base is aluminum.

Additionally or alternatively, in this or other embodiments, the panel is aluminum, copper, steel, a conductive polymer, or a conductive composite.

Additionally or alternatively, in this or other embodiments, the panel includes a coolant channel for convective heat transfer from the panel.

Additionally or alternatively, in this or other embodiments, the conductive base includes a second coolant channel for convective heat transfer from the conductive base.

Additionally or alternatively, in this or other embodiments, the conductive base includes a second coolant channel for convective heat transfer from the conductive base.

In another embodiment, a method of assembling a thermoelectric power generation system includes forming a first side of a tower with a solar panel array to absorb solar radiation and generate electrical energy and waste heat and forming a second side of the tower, opposite the first side, with a panel. The method also includes disposing a plurality of thermoelectric elements between the solar panel array and the panel. The plurality of thermoelectric elements converts conductive heat flow of the waste heat from the solar panel directed toward the panel to electrical energy. A conductive base is attached to the tower to support the tower and to conduct heat away from the panel.

Additionally or alternatively, in this or other embodiments, the method also includes disposing insulating material between the solar panel array and the panel around the thermoelectric elements.

Additionally or alternatively, in this or other embodiments, the method also includes arranging a gimbal between the base and the tower to control an orientation of the tower.

Additionally or alternatively, in this or other embodiments, the arranging the gimbal includes configuring the gimbal to change a position of the tower in a first dimension and in a second dimension, perpendicular to the first dimension.

Additionally or alternatively, in this or other embodiments, the method also includes configuring a controller to control the gimbal.

Additionally or alternatively, in this or other embodiments, the attaching the conductive base includes attaching an aluminum base to the tower.

Additionally or alternatively, in this or other embodiments, the attaching the conductive base to the tower includes attaching the conducting base to the panel at a first end.

Additionally or alternatively, in this or other embodiments, the method also includes configuring the conductive base to be affixed at a surface location at an edge of a permanently shadowed region at a second end of the conductive base.

Additionally or alternatively, in this or other embodiments, the forming the second side of the tower with the panel includes forming the second side of the tower with an aluminum panel, copper panel, steel panel, conductive polymer panel, or conductive composite panel.

Additionally or alternatively, in this or other embodiments, the forming the second side of the tower with the panel includes forming the second side of the tower with the panel including a coolant channel configured for convective heat transfer from the panel or the attaching the conductive base includes attaching the conductive base including a second coolant channel configured for convective heat transfer from the conductive base.

BRIEF DESCRIPTION OF THE DRAWINGS

The following descriptions should not be considered limiting in any way. With reference to the accompanying drawings, like elements are numbered alike:

FIG. 2 shows aspects of the thermoelectric power generation system according to one or more embodiments.

DETAILED DESCRIPTION

Figure 1:
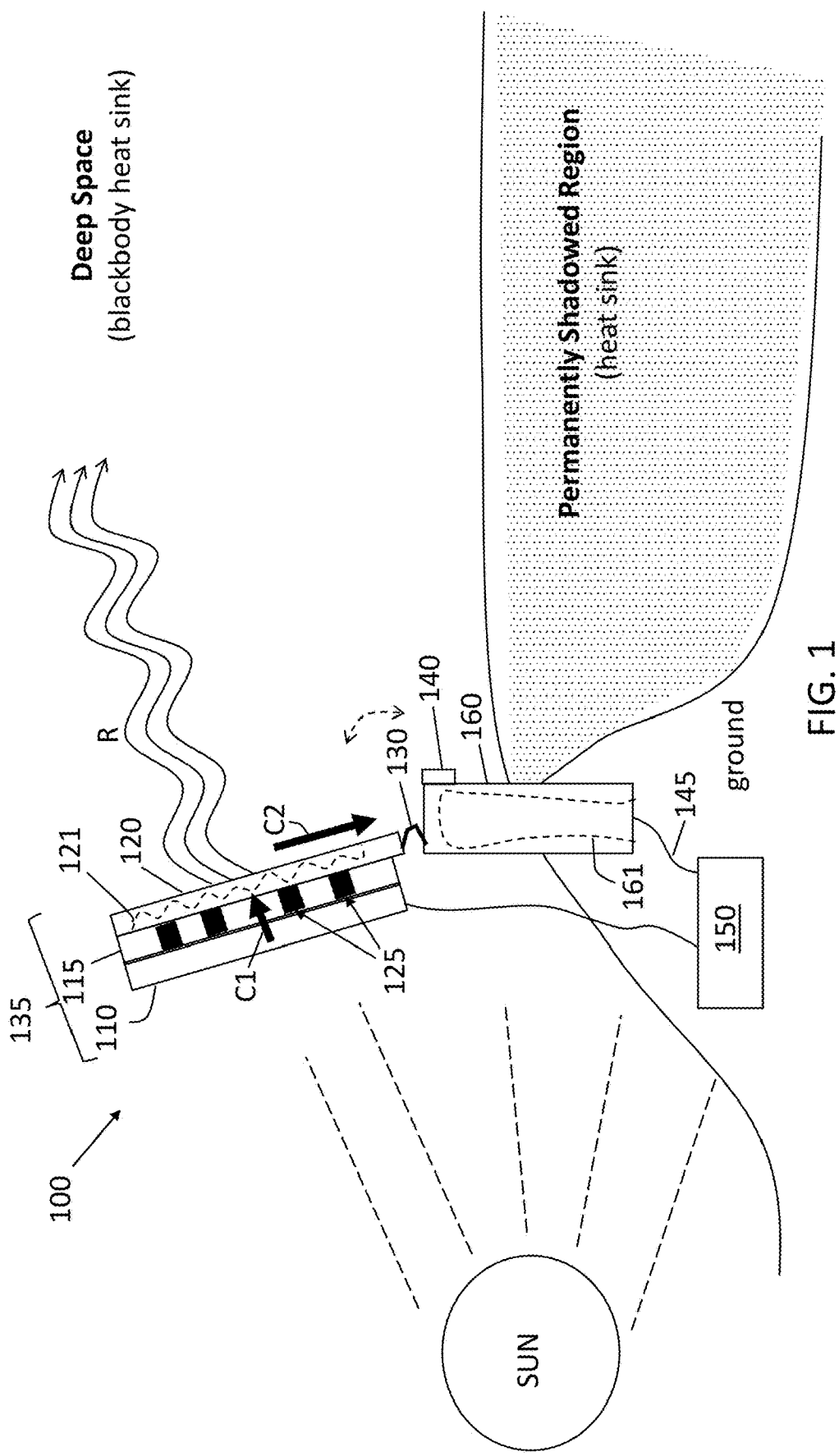
FIG. 1 illustrates a thermoelectric power generation system according to one or more embodiments.

A detailed description of one or more embodiments of the disclosed apparatus and method are presented herein by way of exemplification and not limitation with reference to the Figures.

As previously noted, the ability to perform power generation in space (e.g., on a lunar surface, on Mars) would reduce the need for energy storage and facilitate longer-term missions. A prior approach to power generation relies on solar panel arrays with photovoltaic modules that use photons radiated from the Sun to generate electricity via the photovoltaic effect. However, solar panel arrays suffer from inefficiency that results in the loss of much of the solar energy in the form of waste heat. Another existing technology that uses solar energy is solar thermoelectric generators (STEGs). A STEG is a solid state device that converts heat flux (i.e., a flow of energy due to a temperature difference) resulting from solar energy absorbed by one part of the STEG into electrical energy via a thermoelectric effect referred to as the Seebeck effect.

Power generation via solar panel arrays and STEGs has been combined in a hybrid system. Specifically, waste heat emanated by the solar panel array is harnessed by the STEG. That is, the conductive transfer of the waste heat through thermoelectric elements is used to generate electricity. Embodiments of the systems and methods detailed herein relate to thermoelectric power generation using radiant and conductive heat dissipation. Specifically, a hybrid system of a solar panel array and STEG is used and the conduction of the waste heat to a cold side of the system through thermoelectric elements is the source of electricity. According to the exemplary embodiments, this heat transfer and, thus, the electricity generation are encouraged by dissipating the transferred heat from the cold side via radiation and conduction. The radiant and conductive heat dissipation maintains the temperature differential required for a functioning STEG. The location and orientation of the hybrid system is controlled to enable effective radiative heat dissipation using deep space as a blackbody heat sink and conductive heat dissipation into a permanently shaded region (PSR).

FIG. 1 illustrates a thermoelectric power generation system 100 according to one or more embodiments. The system 100 includes a solar panel array 110 that represents a hot side of the thermoelectric generator and a panel 120 of the thermoelectric generator that may be a metal (e.g., aluminum, copper, steel) or a conductive polymer or conductive composite. The material of the panel 120 may be selected based on thermal properties. An insulator 115 is between the solar panel array 110 and panel 120 and includes a number of known thermoelectric elements 125 that contact the solar panel array 110 on one side and the panel 120 on the other to direct the flow of heat from the solar panel array 110 to the panel 120. The thermoelectric elements 125 convert the thermal energy (i.e., waste heat) flowing from the solar panel array 110 to the panel 120 into electrical energy. The solar panel array 110, insulator 115, and panel 120 may be referred to together as a tower 135.

The electrical energy produced by the thermoelectric elements 125 may be provided via a wire 145 to a load 150. The load 150 will also receive electrical energy produced by photovoltaic modules of the solar panel array 110, as indicated. The load 150 may be a habitat or equipment that requires electrical energy. While four thermoelectric elements 125 are shown for illustrative purposes, the number of thermoelectric elements 125 may be based on the size of the insulator 115 and/or on the power generation needs. The cross-sectional area and length of each thermoelectric element 125, as well as the material from which it is fabricated, may also be selected based on the energy demands and the available space.

The thermoelectric power generation system 100 is shown with a gimbal 130 that facilitates control of the orientation of the tower 135. The gimbal 130 allows the tower 135 to be oriented up or down and from side to side, according to the arrangement shown in FIG. 1, based on a position of the sun, the source of solar radiation. That is, the gimbal 130 facilitates changing a position of the tower 135 in two dimensions that are perpendicular to each other. One of the dimensions is indicated in FIG. 1 and the other is indicated in FIG. 2. A controller 140 may be used to implement orientation control of the tower 135. The controller 140 may be collocated, as shown, or may be located away from the rest of the thermoelectric power generation system 100 such that control is remote via cables or wirelessly. The solar panel array 110 is oriented toward and to maximize exposure to solar radiation while keeping the panel 120 oriented toward the deep space, which serves as a blackbody radiative heat sink.

A portion of the solar radiation from the sun that is absorbed by the solar panel array 110 is not used for power generation by the photovoltaic modules due to inefficiency. As indicated in FIG. 1, this waste heat is transferred through the tower 135 from the solar panel array 110 side to the panel 120 side as conductive heat flow C1 due to the thermal gradient. The thermoelectric elements 125 produce electrical energy based on this conductive heat flow C1. Thus, the power generated by the thermoelectric elements 125 is proportional to the temperature difference between the solar panel array 110 side and the panel 120 side, since a higher temperature difference results in greater heat flow C1.

According to one or more embodiments, the thermoelectric power generation system 100 benefits from increased dissipation of heat from the panel 120 via conductive heat transfer, indicated as C2, in addition to radiative heat transfer, indicated as R. The dissipation of heat from the panel 120 maintains a temperature gradient between the solar panel array 110 and the panel 120 and encourages conductive heat flow C2 and, thus, power generation by the thermoelectric elements 125. The orientation of the tower 135 is controlled, based on the gimbal 130 and the controller 140, to orient the solar panel array 110 toward the incoming solar radiation while keeping the panel 120 oriented toward the blackbody radiative sink that is deep space. This orientation facilitates radiative dissipation of the waste heat originating from the solar panel array 110 from the panel 120.

A conductive base 160 of the thermoelectric power generation system 100, which supports the tower 135, is a metal (e.g., aluminum). As shown in FIG. 1, the base 160 is physically coupled to the tower 135. Specifically, the base 160 is attached to the panel 120 at one end and is affixed to the ground (e.g., planetary surface such as the lunar surface) at an opposite end. According to one or more embodiments, the location of the thermoelectric power generation system 100 and specifically the base 160 is selected to be at an edge of a PSR, as shown. Because of its location at the edge of the (cold) PSR, the base 160 promotes conductive heat flow, indicated as C2, from the panel 120 down the base 160 and into the ground. Thus, in addition to radiative dissipation of heat based on the orientation of the panel 120 toward deep space, the panel 120 also experiences conductive dissipation of heat based on the location of the base 160 near the PSR.

According to one or more alternative embodiments, convective heat flow may be used in addition to the radiative and conductive heat dissipation of the panel 120. A coolant channel 121 is indicated within the panel 120 and a coolant channel 161 is indicated within the base 160. The source of each coolant channel 121, 161 may be at the habitat or near the base 160, for example. The exemplary path shown for each coolant channel 121, 161 is not intended to be limiting. According to one alternate embodiment, only the coolant channel 121 is used to additionally cool the panel 120 via convective heat transfer from the panel 120 to the coolant flowing within the coolant channel 121. According to another alternate embodiment, only the coolant channel 161 is used to cool the base 160 via convective heat transfer to further encourage conductive heat transfer, indicated as C2, from the panel 120 to the base 160. According to yet another alternate embodiment, both of the coolant channels 121 and 161 are used. In addition, the panel 120 may be painted white to maximize thermal emissivity.

FIG. 2 shows aspects of the thermoelectric power generation system 100 according to one or more embodiments. While FIG. 1 is a side view of the tower 135, the perspective view in FIG. 2 shows only the solar panel array 110 of the tower 135 and the solar panels 210. The dashed arc indicates the second (side-to-side) dimension in which the hinge 130 facilitates positioning of the tower 135 to orient the solar panels 210 to face the solar radiation.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A thermoelectric power generation system comprising:
    a solar panel array on a first side of a tower configured to absorb solar radiation and generate electrical energy and waste heat;
    a panel on a second side, opposite the first side, of the tower, wherein the second side of the tower is on a first side of the panel and, based on a positioning of the thermoelectric power generation system, the panel is configured to dissipate, from a second side of the panel, a first portion of the waste heat that reaches the panel via radiative dissipation;
    a plurality of thermoelectric elements of the tower interposed between the solar panel array and the panel, the plurality of thermoelectric elements being configured to convert conductive heat flow of a second portion of the waste heat from the solar panel directed toward the panel to electrical energy;
    a conductive base attached to the panel at a first end to support the tower and configured to conduct heat away from the panel and into a ground based on being positioned in the ground at a second end, opposite the first end; and
    a coolant channel within the panel that convectively transfers heat of a third portion of the waste heat from the panel.

2. The thermoelectric power generation system according to claim 1, further comprising insulating material between the solar panel array and the panel around the thermoelectric elements.

3. The thermoelectric power generation system according to claim 1, further comprising a gimbal configured to control an orientation of the tower.

4. The thermoelectric power generation system according to claim 3, wherein the gimbal is configured to change a position of the tower in a first dimension and in a second dimension, perpendicular to the first dimension.

5. The thermoelectric power generation system according to claim 3, further comprising a controller to control the gimbal.

6. The thermoelectric power generation system according to claim 1, wherein the conductive base is aluminum.

7. The thermoelectric power generation system according to claim 1, wherein the panel is aluminum, copper, steel, a conductive polymer, or a conductive composite.

8. A method of assembling a thermoelectric power generation system, the method comprising:
    forming a first side of a tower with a solar panel array configured to absorb solar radiation and generate electrical energy and waste heat;
    forming a second side of the tower, opposite the first side, with a panel, wherein the second side of the tower is on a first side of the panel;
    configuring the panel to dissipate, from a second side of the panel based on a positioning of the thermoelectric power generation system, a first portion of the waste heat that reaches the panel via radiative dissipation;
    disposing a plurality of thermoelectric elements between the solar panel array and the panel, the plurality of thermoelectric elements being configured to convert conductive heat flow of a second portion of the waste heat from the solar panel directed toward the panel to electrical energy;
    attaching a conductive base to the panel at a first end to support the tower and configuring the conductive base to be positioned in a ground at a second end, opposite the first end, to conduct heat away from the panel and into the ground; and
    forming a coolant channel within the panel that convectively transfers a third portion of the waste heat from the panel.

9. The method according to claim 8, further comprising disposing insulating material between the solar panel array and the panel around the thermoelectric elements.

10. The method according to claim 8, further comprising arranging a gimbal between the base and the tower to control an orientation of the tower.

11. The method according to claim 10, wherein the arranging the gimbal includes configuring the gimbal to change a position of the tower in a first dimension and in a second dimension, perpendicular to the first dimension.

12. The method according to claim 11, further comprising configuring a controller to control the gimbal.

13. The method according to claim 8, wherein the attaching the conductive base includes attaching an aluminum base to the tower.

14. The method according to claim 8, wherein the attaching the conductive base to the tower includes attaching the conducting base to the panel at a first end.

15. The method according to claim 10, further comprising configuring the conductive base to be affixed at a surface location at an edge of a permanently shadowed region at a second end of the conductive base.

16. The method according to claim 8, wherein the forming the second side of the tower with the panel includes forming the second side of the tower with an aluminum panel, copper panel, steel panel, conductive polymer panel, or conductive composite panel.

\* \* \* \* \*